Sept. 22, 1970 R. A. RAUSCH 3,529,612

PULSE FREQUENCY CONVERTER

Filed Feb. 23, 1968

INVENTOR.
ROGER A RAUSCH

BY Ronald T. Reiling
ATTORNEY

United States Patent Office 3,529,612
Patented Sept. 22, 1970

3,529,612

PULSE FREQUENCY CONVERTER

Roger A. Rausch, Minneapolis, Minn., assignor to Honeywell Inc., Minneapolis, Minn., a corporation of Delaware Filed Feb. 23, 1968, Ser. No. 707,790
Int. Cl. F15c *1/08, 3/00*
U.S. Cl. 137—81.5 7 Claims

ABSTRACT OF THE DISCLOSURE

A fluid pulse frequency converter comprising a fluid amplifier, a pair of passages of unequal lengths connected to supply a train of pulses to opposing control ports of the amplifier and integration means connected to the amplifier output. The length of the longer passage is variable and is temperature dependent such that a temperature independent signal delay time is provided thereby. The output of the converter is an analog signal dependent only on the repetition rate of the input pulse train.

The invention herein described was made in the course of or under a contract, or subcontract thereunder, with the Department of the Air Force.

BACKGROUND OF THE INVENTION

This invention relates generally to fluid handling apparatus, and more specifically to fluid digital-to-analog converters.

Fluid amplifiers and other fluidic devices have the inherent characteristics of relative simplicity, high reliability and exceptional environmental tolerance. Because of these characteristics such devices are especially attractive for use in control systems. However, only recently has the fluidics art advanced to the point that complete systems utilizing fluidic components are feasible. As the field of fluid systems design has expanded, fluid components capable of performing an increasing number of functions have been required. One such function, the performance which is necessary in many systems, is the conversion of digital signals into analog signals. Accordingly, there exists a need for a simple, reliable fluid digital-to-analog converter.

SUMMARY OF THE INVENTION

The applicant's pulse frequency converter comprises fluid amplifier means and means for supplying an input pulse train to opposing control ports of the amplifier through passages of different lengths. At least one of the passages is of variable, temperature dependent length. Further, the length of this passage varies with temperature as the acoustic velocity in the working fluid varies with temperature. In addition, integration means is provided at the amplifier output.

The output signal from the amplifier is a pulse train having the same repetition rate as the input pulse train and having a pulse duration which is independent of temperature. The output pulse train from the amplifier is integrated in the integration means. The output of the integration means is an analog signal which is indicative only of the repetition rate of the input pulse train.

In accordance with the teachings of this invention, a true digital-to-analog conversion, is accomplished with a minimum amount of hardware. The use of a minimum amount of hardware minimizes the cost and complexity of the converter and increases its reliability. Thus, the applicant has provided a unique digital-to-analog converter which achieves a true digital-to-analog conversion with apparatus of maximum simplicity.

DESCRIPTION OF THE PREFERRED EMBODIMENT

Figures 1, 2:
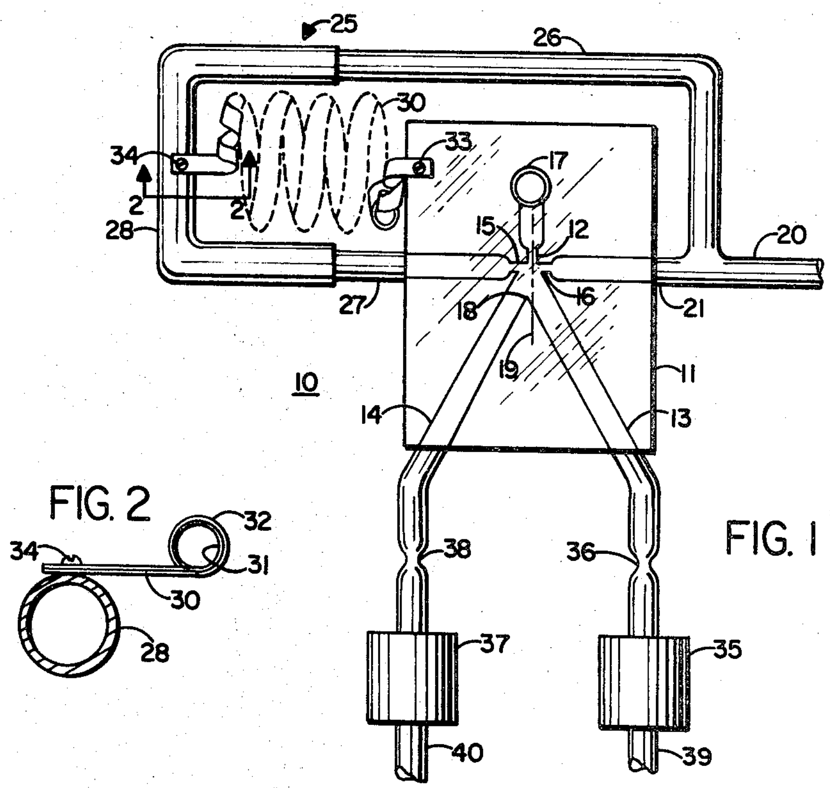
FIG. 1 is a schematic representation of a preferred embodiment of a fluid digital-to-analog converter in accordance with the applicant's invention.
FIG. 2 is an enlarged sectional view of a portion of the converter of FIG. 1 showing the construction of a suitable drive element for use therein.

Reference numeral 10 generally refers to a preferred embodiment of the applicant's digital-to-analog converter. Reference numeral 11 refers to a monostable fluid amplifier having a power nozzle 12 which is adapted to be connected to a source of fluid under pressure (not shown) by means of a conduit 17. Amplifier 11 also includes a preferred outlet passage 13, a non-preferred outlet passage 14, a first control port 15 and a second control port 16. Control port 15 is oriented to deflect a stream of fluid issuing from power nozzle 12 into output passage 13. Control port 16 is oriented to deflect a stream of fluid issuing from power nozzle 12 into outlet passage 14.

Amplifier 11 is shown as being monostable by virtue of the fact that splitter element 18, which is located between outlet passages 13 and 14, is offset with respect to the center line of power nozzle 12 which is indicated by reference numeral 19. It should, however, be noted that amplifier 11 is not the only type of amplifier that can be used in the applicant's converter. Other types of amplifiers and biasing arrangements can equally as well be used. For example, a bistable amplifier having an additional control port which is supplied with a bias signal to normally bias the output of the amplifier from one of the outlet passages can also be used. Further, a bistable amplifier can be used if means is provided for biasing the input signals such that the signals supplied to one control port have a greater amplitude than the signals supplied to the opposing control port. Similarly, means may be provided for attenuating the signals supplied to one control port.

Converter 10 includes an input conduit 20 which is connected to a signal source (not shown). The signal source must produce a train of fluid pulses having a repetition rate which is indicative of the information being transmitted. Input conduit 20 is connected to control port 16 of amplifier 11 through a short conduit 21 which provides a signal path of negligible length. In addition, input conduit 20 is connected to control port 15 through signal delay means 25 which provides a signal path of length L.

Signal delay means 25 includes the first conduit 26 connected to conduit 20 and a second conduit 27 connected to control port 15. Conduits 26 and 27 are connected by means of a sliding trombone conduit 28. Signal delay means 25 also include temperature responsive drive means 30 which is shown as comprising a compound helical bimetallic element. The structure of drive element 30 can best be understood by reference to FIG. 2 which shows an enlarged view of a portion of drive element 30 taken along line 2—2 in FIG. 1.

Drive element 30 is constructed of a bimetallic strip comprising two integrally joined strips of different metals having different coefficients of thermal expansion. The bimetallic strip is first wound into a minor helix. Accordingly, one metal lies on the outside of the helix and the other metal lies on the inside of the helix as illustrated in FIG. 2. The minor helix is then coiled into a major helix. A bimetallic element so made will expand or contract along the central axis of the major helix when the temperature of the element is changed. The described result in the major helix is due to the fact that the winding of the minor helix is such as to produce a torsional or twisting effect along the axis of the minor helix when its temperature changes. As will hereinafter be discussed, it is desired that the drive element expand axially along its axis when heated and contract when cooled. In order to achieve this result, the metal strip indicated by reference numeral 32 is made of a metal having a higher coefficient of thermal expansion than the strip of metal indicated by reference numeral 31.

The previously described drive element is advantageous for use in the applicant's converter because of its large overall coefficient of thermal expansion. In addition, the temperature response of such a drive element approximates the mathematical function required of a drive element for the applicant's converter. Although this drive element is particularly suitable, it should be apparent that other drive means can also be made to perform satisfactorily. For example, a sealed bellows containing a fluid having the proper coefficient of thermal expansion can be used. However, it should be noted that if drive means having a relatively small overall coefficient of thermal expansion is used, it may be necessary to increase the throw provided thereby by means of an arrangement of levers and linkages.

In FIG. 1, bimetallic drive element 30 is shown mounted between the housing of amplifier 11 and trombone conduit 28. One end of drive element 30 is secured to the housing of amplifier 11 by means of a screw 33. The other end of drive element 30 is secured to trombone conduit 28 by means of a screw 34. It will be apparent that there are other satisfactory means for securing drive element 30 in place. For example, adhesives or clamps can also be used. It can further be seen that with drive element 30 secured in place as shown, trombone conduit 28 is caused to assume a position relative to the remaining structure of converter 10 which is dependent upon temperature.

Outlet passage 13 of amplifier 11 is connected to an inlet of a first capacitance tank 35 through a first fluid resistor 36. Similarly, outlet passage 14 is connected to an inlet of a second capacitance tank 37 through a second fluid resistor 38. Capacitance tanks 35 and 37 and fluid resistors 36 and 38 comprise integration means for integrating the output signals from amplifier 11. The outlets of capacitance tanks 35 and 37 constitute the signal output of converter 10. The outlets of capacitance tanks 35 and 37 are connected to any desired utilization device (not shown) by means of conduits 39 and 40.

One use for which the applicant's unique digital-to-analog converter is well suited is in a control system for a turbojet engine. The operation of converter 10 will be discussed with reference to this usage. One of the signals required in many turbojet engine control systems is an analog signal indicative of the combustion chamber temperature of the engine being controlled. It has been found advantageous to sense the combustion chamber temperature by means of a fluidic temperature sensor. Such a temperature sensor commonly comprises a temperature sensitive fluid oscillator having an output signal whose frequency is indicative of the temperature being sensed. This output signal is supplied to a fluidic limiting and shaping circuit. The output signal from the limiting and shaping circuit is a well defined train of fluid pressure pulses having a repetition rate which is the same as the frequency of the output signal from the temperature sensor. This pulse train is transmitted to converter 10 which functions to convert it into an analog signal as follows.

Power nozzle 12 of amplifier 11 is connected to a source of fluid under pressure through conduit 17 and normally issues a stream of fluid along center line 19. Due to the asymmetrical shape and location of splitter element 18 relative to center line 19, the stream issuing from power nozzle 12 enters outlet passage 13 unless the pressure at control port 16 exceeds the pressure at control port 15. Thus, the output signal from amplifier 11 is normally from outlet passage 13.

Figure 3:
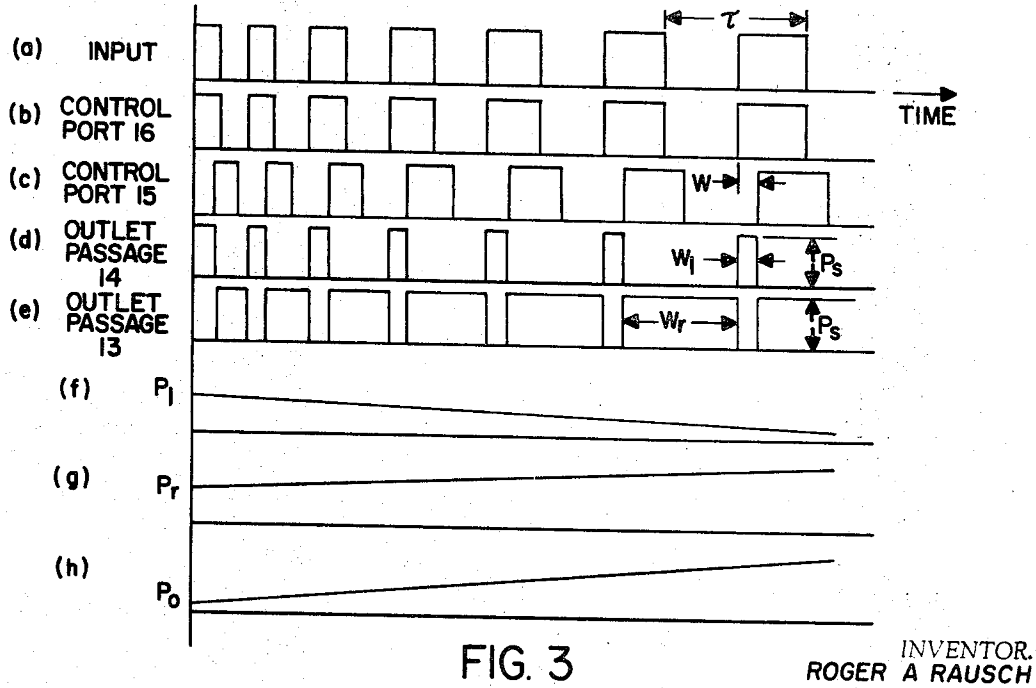
FIG. 3 is an illustration of typical fluid signals which may exist at various points in the applicant's converter.

The effect of an input train of fluid pressure pulses will now be considered. For the purpose of this discussion, it will be assumed that amplifier 11 is a monostable amplifier or is a bistable amplifier biased to operate in a monostable manner. The pulse train from the limiting and shaping circuit is shown in FIG. 3(*a*) as comprising a square wave having a decreasing repetition rate, thus indicating a decreasing combustion chamber temperature in the engine being controlled. This pulse train is transmitted to control ports 16 and 15 of amplifier 11 through conduit 20, short circuit 21 and signal delay means 25. The pulse trains supplied to control ports 16 and 15 are shown in FIG. 3(*b*) and FIG. 3(*c*). The repetition rate of the input pulse train will be designated by the symbol N. Since the period of a periodic signal is inversely proportional to its repetition rate, the period of the input pulse train, designated by the symbol $\tau$, is given by $\tau=1/N$.

The leading edge of a given pulse in the input pulse train in conduit 20 enters conduits 21 and 26 simultaneously. The leading edge of the pulse will appear at control port 16 substantially instantaneously due to the very short length of conduit 21. The time relationship between the input signal and the signal supplied to control port 16 can be seen by comparing FIGS. 3(*a*) and 3(*b*). The presence of a pressure signal at control port 16 causes the fluid stream issuing from power nozzle 12 to switch from outlet passage 13 to outlet passage 14.

After a period of time W has elapsed, the length of which is dependent on the length L of the signal path provided by signal delay means 25 and the acoustic velocity C in the fluid within signal delay means 25, the leading edge of the pulse reaches control port 15. The time relationship between the signals supplied to control ports 15 and 16 can be seen by comparing FIGS. 3(*b*) and 3(*c*). The pressures at control ports 15 and 16 are now equal. Thus, the fluid stream issuing from power nozzle 12 switches back to outlet passage 13. Accordingly, the time duration of the pulse in outlet passage 14, designated by symbol $W_1$, is equal to W, the signal delay time provided by signal delay means 25 as shown in FIG. 3(*d*). $W_1$ is given in terms of L and C by the expression, $W_1=W=L/C$. However C equals $K\sqrt{T}$ where K is a constant. Thus, $W_1=L/(K\sqrt{T})$. Since the stream issuing from power nozzle 12 is present in either outlet passage 13 or outlet passage 14 at all times, there is an output from outlet passage 13 at any time that there is no output from outlet passage 14 as shown in FIG. 3(*e*). Using $W_r$ to designate the time duration of the pulses from outlet passage 13, it can be seen that $$W_1+W_r=\tau=1/N$$

Therefore, $W_r=1/N-W_1=1/N-L/(K\sqrt{T})$.

The pulse amplitude of the output signals from each of the outlet passages 13 and 14 is dependent on the pressure supplied to power nozzle 12 and is designated $P_s$. The combination of fluid resistor 38 and capacitance tank 37 connected to outlet passage 14 functions to integrate the pressure pulse train therein, thus producing an analog pressure signal which is proportional to the pulse amplitude $P_s$, pulse duration $W_1$ and pulse repetition rate N of the signal in outlet passage 14. Similarly, the combination of fluid resistor 36 and capacitance tank 35 connected to outlet passage 13 functions to integrate the pressure pulse train therein, thus producing an analog pressure signal which is proportional to the pulse amplitude $P_s$, pulse duration $W_r$, and pulse repetition rate N of the signal in outlet passage 13. The magnitude of the analog pressure signal $P_1$ which is supplied to conduit 40 from capacitance tank 37 is given by the expression $$P_1=K'P_sNW_1=K'P_sNL/(K\sqrt{T})$$

where K' is a constant of proportionality. Similarly, the magnitude of the analog pressure signal $P_r$ supplied to conduit 39 from capacitance tank 35 is given by $$P_r=K'P_sN[1/N-L/(K\sqrt{T})]$$

Pressure signals $P_1$ and $P_r$ are shown graphically in FIGS. 3(*f*) and 3(*g*). The relationship between $P_1$, $P_r$ and the input signal can be seen by comparing FIGS. 3(*f*), 3(*g*), and 3(*a*). The pressure differential output signal from converter 10 is the pressure difference between conduits 40 and 39 and is given by $P_0$. Pressure signal $P_0$ is graphically illustrated in FIG. 3(*h*). Its relationship to the input signal can be seen by comparing FIG. 3(*h*) with FIG. 3(*a*). The analog output signal from converter 10 is given by the expression, $$P_0=P_1-P_r=K'P_sN[L/(K\sqrt{T})-1/N+L/(K\sqrt{T})]=K'P_s[2NL/(K\sqrt{T})-1]$$

It is pointed out that, although the output signal from converter 10 is given as the pressure differential between conduits 39 and 40, the pressure signal produced in either conduit 39 or conduit 40 alone can also be utilized as an output signal. Thus, $P_0$, $P_1$ and $P_r$ may all be utilized as output signals from converter 10.

Drive element 30 is constructed of metal strips 31 and 32 having coefficients of expansion such that L is equal to $K\sqrt{T}/(2K')$. Accordingly, $P_0$, $P_1$ and $P_r$ are given by the expressions, $P_0=P_s(N-K')$, $P_1=P_sN/2$ and $$P_r=P_s(K'-N/2)$$

Thus, if the supply pressure to power nozzle 12, and consequently $P_s$ is held constant, $P_0$, $P_1$ and $P_r$ are functions only of the repetition rate N of the input pulse train. Further, the output signals from converter 10 are analog pressure signals. Thus, it has been shown that the applicant's unique digital-to-analog converter performs a true digital-to-analog conversion, independent of the temperature of the fluid therein.

As was hereinbefore noted, a bistable device can be substituted for amplifier 11. However, such an embodiment is subject to the requirement that signal delay means 25 must delay the arrival of a given pulse at control port 15 until the pulse has completely disappeared at control port 16. Further, the pulsces supplied to control 16 must have a greater amplitude than the pulses supplied to control port 15. The reason for these requirements is that a bistable device will not switch in response to a signal at one control port if a signal having the same amplitude is present at the opposing control port.

If the previously noted requirements are met, the operation of an embodiment of the applicant's converter utilizing a bistable device is substantially identical to the operation described for converter 10. In addition, the equations for such an embodiment are the same as those used hereinbefore in the discussion of converter 10. It should, however, be noted that if amplifier 11 is replaced with a bistable element, the delay time required from signal delay means 25 must be increased. This can be done by lengthening the signal path provided by signal delay means 25 which, then, must be provided with increased temperature compensation.

From the foregoing discussion, it can be seen that a primary requirement for the applicant's invention is that the input pulse train be transmitted to the control ports of amplifier 11 such that there is a time differential between the arrival of the given pulse at control port 16 and the arrival of the same pulse at control port 15. Further, the difference in arrival times must be independent of temperature. An embodiment of the applicant's invention has been described in which these requirements have been met by utilizing only one signal delay means. It is, however, pointed out that an embodiment of the invention wherein conduit 21 is replaced with a second signal delay means will function equally as well. In such an embodiment, the second signal delay means is constructed so as to provide a different signal path length than that provided by signal delay means 25. Thus, a given input pulse arrives at control ports 15 and 16 at different times. The difference in arrival times can be made independent of temperature by controlling the lengths of the signal paths such that the signal delay time provided by each path is independent of temperature. Alternately, the length of the signal paths can be controlled such that only the difference in signal delay times provided by the signal paths is independent of temperature.

In addition to digital-to-analog conversion, the applicant's invention is capable of performing other useful functions. As has previously been discussed, if an input signal comprising a train of fluid pressure pulses is supplied to conduit 20, the output signal from outlet passage 14 of amplifier 11 is a train of pulses having the same repetition rate as the input pulse train and having a constant pulse width. Further, the output signal from outlet passage 13 is a train of pulses wherein the pulses are separated by equal time intervals. Thus, when no integration means is provided, the applicant's invention converts input pulses of varying widths into both uniform output pulses of varying widths into both uniform output pulses and pulses which are separated by equal time intervals.

The applicant's invention has thus been shown to be capable of converting an input train of non-uniform fluid pressure pulses into an analog pressure signal having a magnitude indicative of only the repetition rate of the input pulses. It has further been shown to be capable of converting an input pulse train of non-uniform fluid pressure pulses into trains of fluid pressure pulses having the same repetition rate as the input pulse train, the pulses of one being of uniform width and the pulses of the other being separated by equal time intervals. Although the invention has been described and illustrated in detail, it should be understood that the same is by way of illustration and example only and is not to be taken by way of limitation. The spirit and scope of this invention are limited only by the terms of the following claims.

What is claimed is:

1. A fluidic pulse frequency converter comprising:

input means including an inlet and an outlet;

fluid amplifier means including a power nozzle, first and second control ports and first and second outlet passages, the power nozzle being adapted to be connected to a source of fluid under pressure;

means connecting the outlet of said input means to the first control port of said fluid amplifier means;

signal delay means having an inlet and an outlet, said signal delay means comprising a passage of variable length and temperature responsive drive means connected to said passage, said signal delay means producting a signal at its outlet in response to a signal at its inlet, said signal delay means also causing a substantially temperature independent time delay between reception of a signal at its inlet and production of a signal at its outlet;

means connecting the outlet of said input means to the inlet of said signal delay means; and means connecting the outlet of said signal delay means to the second control port of said fluid amplifier means.

2. The fluidic pulse frequency converter of claim 1 wherein said fluid amplifier means is monostable such that an output from the first outlet passage is provided only if a signal is supplied to the first control port and no signal is supplied to the second control port.

3. The fluidic pulse frequency converter of claim 2 wherein said temperature responsive drive means comprises a bimetallic strip formed into a compound helix.

4. The fluidic pulse frequency converter of claim 3 further including integration means having an inlet and an outlet and means connecting the first and second outlet passages of said fluid amplifier means to the inlet of said integration means.

5. In combination:

fluid amplifier means including a power nozzle, first and second control ports and first and second outlet passages, the power nozzle being adapted to be connected to a source of fluid under pressure;

input means; and connecting means comprising first signal transfer means connecting said input means to the first control port of said fluid amplifier means, said first signal transfer means being operable to provide a signal path of substantially fixed length, and second signal transfer means connecting said input means to the second control port of said fluid amplifier means, said second signal transfer means including a passage having a slideable section and temperature responsive drive means connected to said slideable section, said second signal transfer means being operable to provide a signal path of variable length, the length thereof being a function of temperature, said connecting means supplying signals to the first and second control ports of said fluid amplifier means in response to a signal at said input means, said connecting means also separating the signals supplied to the first and second control ports of said fluid amplifier means by a substantially fixed time interval.

6. The combination according to claim 5 further including integration means having an inlet and an outlet and means connecting the first and second outlet passages of said fluid amplifier means to the inlet of said integration means.

7. The combination according to claim 6, wherein said fluid amplifier means includes a splitter element which is asymmetric with respect to the power nozzle such that an output is provided from the first outlet passage only when the signal supplied to the first control port of said fluid amplifier means is substantially larger than the signal supplied to the second control port of said fluid amplifier means.

References Cited

UNITED STATES PATENTS

| | | | |
|---|---|---|---|
| 3,426,781 | 2/1969 | Neuman | 137—815 |
| 3,442,281 | 5/1969 | Warren | 137—815 |
| 3,451,411 | 6/1969 | Johnson | 137—815 |
| 3,461,898 | 8/1969 | Bellman et al. | 137—815 |
| 3,465,775 | 9/1969 | Rose | 137—815 |
| 3,171,421 | 3/1965 | Joesting | 137—815 |
| 3,204,652 | 9/1965 | Bauer | 137—815 |
| 3,228,410 | 1/1966 | Warren et al. | 137—815 |
| 3,266,510 | 8/1966 | Wadey | 137—815 |
| 3,302,398 | 2/1967 | Taplin et al. | 137—815 XR |
| 3,379,204 | 4/1968 | Kelley et al. | 137—815 |
| 3,417,813 | 12/1968 | Perry | 137—815 XR |
| 3,426,782 | 2/1969 | Thorburn | 137—815 |

SAMUEL SCOTT, Primary Examiner